United States Patent
Rahman et al.

(10) Patent No.: US 8,525,565 B2
(45) Date of Patent: Sep. 3, 2013

(54) FAMILY OF MULTIPLEXER/FLIP-FLOPS WITH ENHANCED TESTABILITY

(75) Inventors: Mujibur Rahman, Plano, TX (US); Timothy D. Anderson, Dallas, TX (US); Alan Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/796,949

(22) Filed: Jun. 9, 2010

(65) Prior Publication Data

US 2013/0169332 A1 Jul. 4, 2013

Related U.S. Application Data

(60) Provisional application No. 61/185,371, filed on Jun. 9, 2009.

(51) Int. Cl.
*H03K 3/289* (2006.01)
*H03K 3/356* (2006.01)

(52) U.S. Cl.
USPC .............................. 327/202; 327/203; 327/208

(58) Field of Classification Search
None
See application file for complete search history.

(56) References Cited

U.S. PATENT DOCUMENTS

| | | | | |
|---|---|---|---|---|
| 5,204,560 A | * | 4/1993 | Bredin et al. | 327/51 |
| 5,719,878 A | * | 2/1998 | Yu et al. | 714/726 |
| 5,999,030 A | * | 12/1999 | Inoue | 327/202 |
| 7,274,233 B2 | * | 9/2007 | Branch et al. | 327/203 |
| 8,352,815 B2 | * | 1/2013 | Frederick, Jr. | 714/726 |
| 2001/0035783 A1 | * | 11/2001 | Kanba | 327/202 |
| 2011/0234283 A1 | * | 9/2011 | Wu | 327/202 |
| 2013/0021076 A1 | * | 1/2013 | Kuenemund et al. | 327/202 |

* cited by examiner

*Primary Examiner* — Tuan T Lam
(74) *Attorney, Agent, or Firm* — Robert D. Marshall, Jr.; Wade James Brady, III; Frederick J. Telecky, Jr.

(57) ABSTRACT

A multibit combined multiplexer and flip-flop circuit has a plurality of bit circuits. Each bit circuit includes and input section, a flip-flop section and a per bit control section. The input sections have inputs for plural of input signals and corresponding input pass gates. The outputs of the input pass gates are connected to the input of the flip-flop section. Each per bit control section includes an inverter for each input terminal. There is a combined control section receiving a clock signal and a control signals for selection of only one of the input signals. The combined control section include a logical AND for each input signal combining the clock signal and the selection signal. The output of each logical AND is connected to the input of a corresponding inverter of each per bit control circuit. The input pass gate are controlled by a corresponding logical AND and said corresponding inverter.

10 Claims, 8 Drawing Sheets

FAMILY OF MULTIPLEXER/FLIP-FLOPS WITH ENHANCED TESTABILITY

CLAIM OF PRIORITY

This application claims priority under 35U.S.C. 119(e)(1) to U.S. Provisional Application No. 61/185,371 filed Jun. 9, 2009.

TECHNICAL FIELD OF THE INVENTION

The technical field of this invention is a high-performance flop with multiplexer at the input.

BACKGROUND OF THE INVENTION

The problem of invention is a high-performance flop with multiplexer built into the input. This combination virtually hides the delay of the multiplexer, reducing a level of logic on critical paths. For the Texas Instruments TMS320C6400 family of digital signal processors (DSPs) this combination yields approximately a 5% frequency improvement over not having this invention.

There is a problem with circuits of this type. Such circuits typically present a problem of stuck-at fault visibility. In prior art, test pin itself was not observable. This yields stuck-at-fault coverage loss. Latest reliability targets require greater than 99% stuck-at-fault coverage.

SUMMARY OF THE INVENTION

This invention is a multibit combined multiplexer and flip-flop circuit having a plurality of bit circuits. Each bit circuit includes and input section, a flip-flop section and a per bit control section. The input sections have inputs for each of a plurality of input signals and corresponding input pass gates. The outputs of the input pass gates are connected to the input of the flip-flop section. Each per bit control section includes an inverter for each input terminal. There is a combined control section receiving a clock signal and a control signals for selection of only one of the input signals. The combined control section include a logical AND for each input signal combining the clock signal and the selection signal. The output of each logical AND is connected to the input of a corresponding inverter of each per bit control circuit. The input pass gate are controlled a corresponding logical AND and said corresponding inverter.

The input section of each bit circuit may include a scan input and a scan input pass gate. The flip-flop section of each bit circuit further includes a scan output. Each per bit control section receives a scan enable input signal.

The input section of each bit circuit further includes a test input terminal and a test select input terminal. The test select input selects input of the test signal or the scan input.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
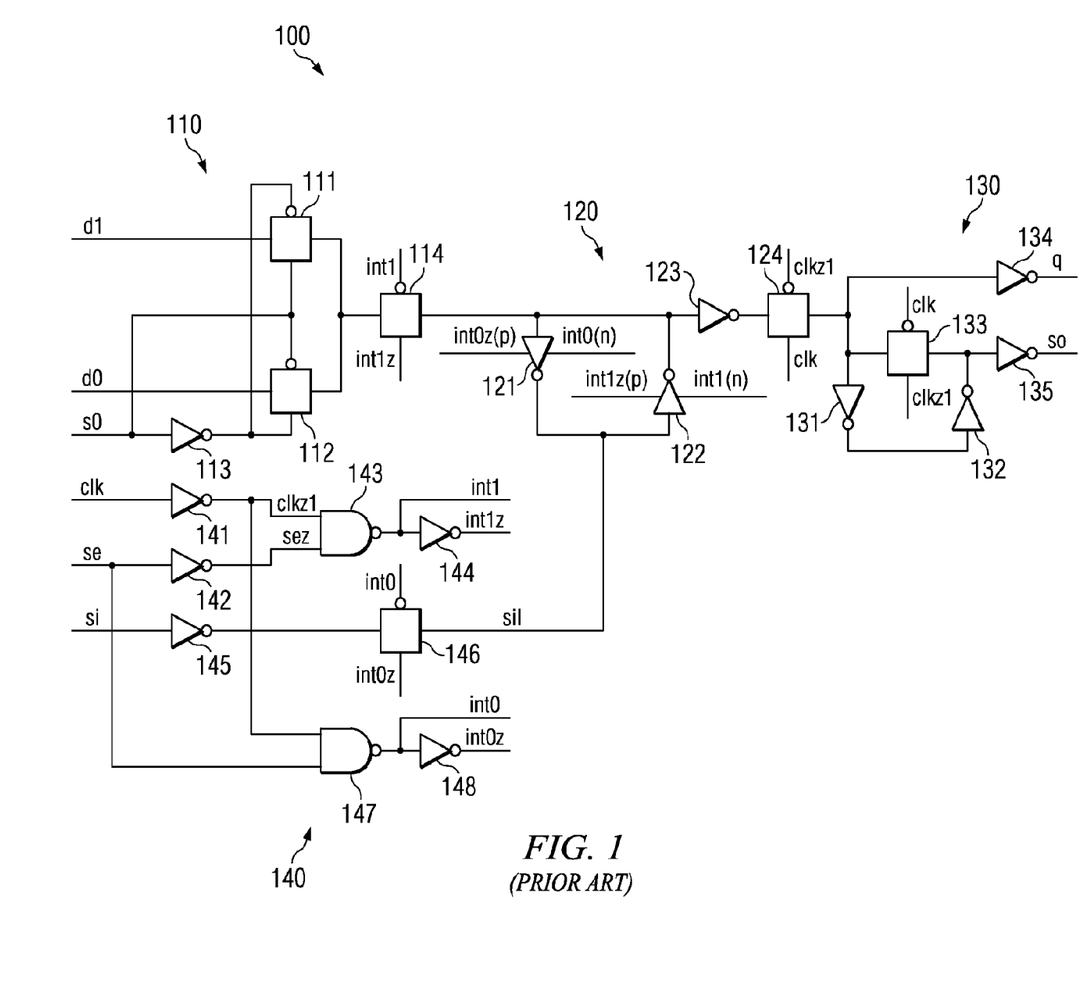
FIG. 1 is a circuit diagram of a prior art two-input multiplexer/flip-flop.

FIG. 1 illustrates a prior art two-input multiplexer/flip-flop 100. FIG. 1 illustrates a single bit circuit of what is generally a multi-bit circuit. Multiplexer/flip-flop 100 includes: input section 110 including pass gates 111, 112 and 114 and inverter 113; master flip-flop section 120 including controlled inverters 121 and 122, inverter 123 and pass gate 124; slave flip-flop section 130 including inverters 131, 132, 134 and 135 and pass gate 133; and control section 140 including inverters 141, 142, 144, 145 and 148, AND gates 143 and 147 and pass gate 146.

Input section 110 receives data inputs d0 and d1 and selection input s0. Pass gates 111 and 112 are driven by opposite polarities of selection input s0 employing inverter 113. Depending upon the digital state of selection input s0, one and only one of pass gates 111 and 112 are conducting the other pass gate in non-conducting. If pass gate 111 is conducting and pass gate 112 is non-conducting, then input section 110 selects input d1. If pass gate 112 is conducting and pass gate 111 is non-conducting, then input section 110 selects input d0. The selected input signal supplies the input of pass gate 114. When conducting pass gate 114 couples the selected input to master flip-flop section 120.

Master flip-flop section 120 includes a latch formed by cross-coupled inverters 121 and 122. Under the proper combination of input control signals the data from the selected data source d0 or d1 is stored in this latch. At the proper time in the cycle of clock clk pass gate 124 supplies the state of the master flip-flop to slave flip-flop section 130.

Slave flip-flop section 130 includes a gated latch formed of inverters 131 and 132 and pass gate 133. Inverter 134 generates a q output of the state of the latch. Inverter 135 generates a scan output signal so of the opposite state of the latch.

Control section 140 receives various input signal and generates control signals for pass gates 111, 112, 114, 124 and 133 and controlled inverters 121 and 122. Control section 140 receives a clock signal clk, a scan enable signal se and a scan data input si. Inverter 141 generates an inverted clock signal clkz1. Inverter 142 generates an inverted scan enable signal sez. NAND gate 143 combines clkz1 and sez to generate int1. Inverter 144 generates the inverse signal int1z. The pair of signals int1 and int1z control pass gate 114 and controlled inverter 122. NAND gate 147 combines clkz1 and se to generate int0. Inverter 148 generates the inverse signal int0z. The pair of signals in01 and int0z control pass gate 146 and controlled inverter 121. Inverter 145 inverts scan data input si. Inverter 145 supplies pass gate 146 controlled by int0 and int0z. Depending upon the state of scan enable signal se only one of the paired signals int0/int0z or int1/int1z are active cycling with the clock signal clk.

Two-input multiplexer/flip-flop 100 operates generally as follows. Select signal s0 determines selection of either input d0 or input d1. When in normal mode as selected by scan enable signal se, the selected signal is passed to master flip-flop section 120 and then to slave flip-flop section 130 where it becomes available at output q. When in scan mode as selected by scan enable signal se, scan input si is input to master flip-flop section 120. This scan input is passed to slave flip-flop section 130 and becomes available at scan output so. Table 1 summarizes this operation.

TABLE 1

| se | s0 | Next Output |
|---|---|---|
| 0 | 0 | d0 |
| 0 | 1 | d1 |
| 1 | X | si |

When scan is enabled (se=1), two-input multiplexer/flip-flop 100 ignores the data inputs d0 and d1 whatever the state of select signal s0 (s0 is X or don't care) and stores scan input si.

There are several disadvantageous aspects of the two-input multiplexer/flip-flop 100. This circuit has a longer than necessary setup time. Note that the input path of two-input multiplexer/flip-flop 100 includes two layers of pass gates. An input signal must pass a first pass gate layer at pass gate 111 or 112 and a second pass gate layer at pass gate 114. This leads to a larger setup than necessary. These two layers of pass gates require a larger driver circuit. Such a larger driver circuit requires greater silicon area and results in more power consumption. These factors all lead to a disadvantageous circuit combination.

Figure 2:
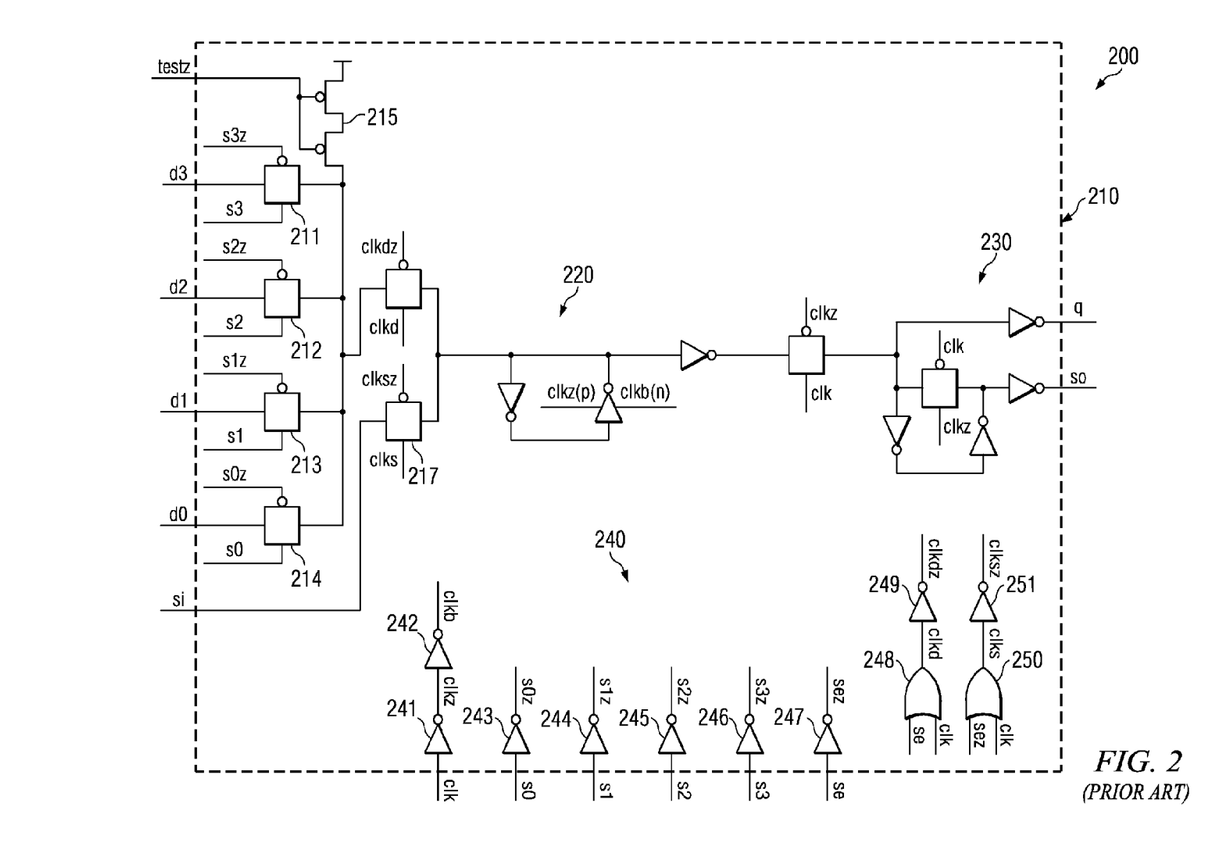
FIG. 2 is a circuit diagram of a prior art four-input multiplexer/flip-flop including a test input.

FIG. 2 illustrates a prior art four-input multiplexer/flip-flop 200. FIG. 2 illustrates a single bit circuit of what is generally a multi-bit circuit. Multiplexer/flip-flop 200 includes: input section 210 including pass gates 211, 212, 213, 214, 216 and 217 and driver 215; master flip-flop section 220 is similar to master flip-flop section 120; slave flip-flop section 230 is similar to slave flip-flop section 130; and control section 240 including inverters 241, 242, 243, 244, 245, 246, 247, 249 and 251, NOR gates 248 and 250.

Input section 210 receives data inputs d0, d1, d2 and d3, selection signal pairs s0/s0z, s1/s1z, s2/s2z and s3/s3z and scan input si. Depending upon the state of the selection signal pairs s0/s0z, s1/s1z, s2/s2z and s3/s3z one of pass gates 211, 212, 213 and 214 passes the corresponding input signal d3, d2, d1 or d0. The selection signals pairs s0/s0z, s1/s1z, s2/s2z and s3/s3z are controlled to open only one of the pass gates 211, 212, 213 and 214. The selected input signal supplies the input of pass gate 216. When conducting pass gate 216 couples the selected input to master flip-flop section 220. This operation is very similar to that of input section 110 except that there are four inputs in input section 210 and they are uncoded as contrast to the coded input used in input section 110. Pass gate 217 when enabled couples scan input s1 to master flip-flop section 220.

Input section 210 further includes a testz input driving the gates of dual MOS transistor driver 215. A signal upon the testz input forces master flip-flop section 220 into a predetermined state regardless of other inputs. This testz input enables test of multiplexer/flip-flop 200.

Master flip-flop section 220 is similar to master flip-flop section 120 and will not be described in detail.

Slave flip-flop section 230 is similar to slave flip-flop section 130 and will not be described in detail.

Control section 240 receives the control signals and generates corresponding signals used in multiplexer/flip-flop 200. Control section 240 receives input signals clk, s0, s1, s2, s3, se and si and generates control signals for pass gates 211, 212, 213, 214, 216 and 217 and the controlled inverters in master flip-flop section 220 and slave flip-flop section 230.

Inverter 241 generates an inverted clock signal clkz1. Inverter 242 generates a further inverted clock signal clkb. Inverter 243 generates an inverted s0 signal s0z. Control signals s0 and s0z control the operation of pass gate 214. Inverter 242 generates an inverted s1 signal s1z. Control signals s1 and s1z control the operation of pass gate 213. Inverter 245 generates an inverted s2 signal s2z. Control signals s2 and s2z control the operation of pass gate 212. Inverter 246 generates an inverted s3 signal s3z. Control signals s3 and s3z control the operation of pass gate 211. Inverter 247 generates an inverted enable signal sez. NOR gate 248 combines clkz and se to generate clkd and inverter 249 generates its inverse clkdz. Signals clkd and clkdz control pass gate 216. NOR gate 250 combines clk and sez to generate clks and inverter 251 generates its inverse clksz. Signals clks and clksz control pass gate 217.

Four-input multiplexer/flip-flop 200 operates generally as follows. Select signals s0, s1, s2 and s3 determine selection of either input d0, d1, d2 or d3. When enabled by scan enable signal se, the selected signal is passed to master flip-flop section 220 and then to slave flip-flop section 230 where it becomes available at output q. Testz places master flip-flop 220 in a known state. Si when enabled by clks/clksz places master flip-flop 220 in a known state.

There are several disadvantageous aspects of the four-input multiplexer/flip-flop 200. As the case of two-input multiplexer/flip-flop 100 this circuit has a longer than necessary setup time. The input path of four-input multiplexer/flip-flop 200 includes two layers of pass gates. An input signal must pass a first pass gate layer at pass gate 211, 212, 213 or 214 and a second pass gate layer at pass gate 216. This leads to a larger setup time than necessary. Such plural pass gate levels require a larger driver circuit. Such a larger driver circuit requires greater silicon area and results in more power consumption. These factors all lead to a disadvantageous circuit combination.

Four-input multiplexer/flip-flop 200 includes an additional disadvantage. Four-input multiplexer/flip-flop 200 includes no provision for testing the testz input. Failure of the testz input cannot be detected in four-input multiplexer/flip-flop 200. This is disadvantageous in requiring indirect diagnosis of faults in the testz input.

Figure 3:
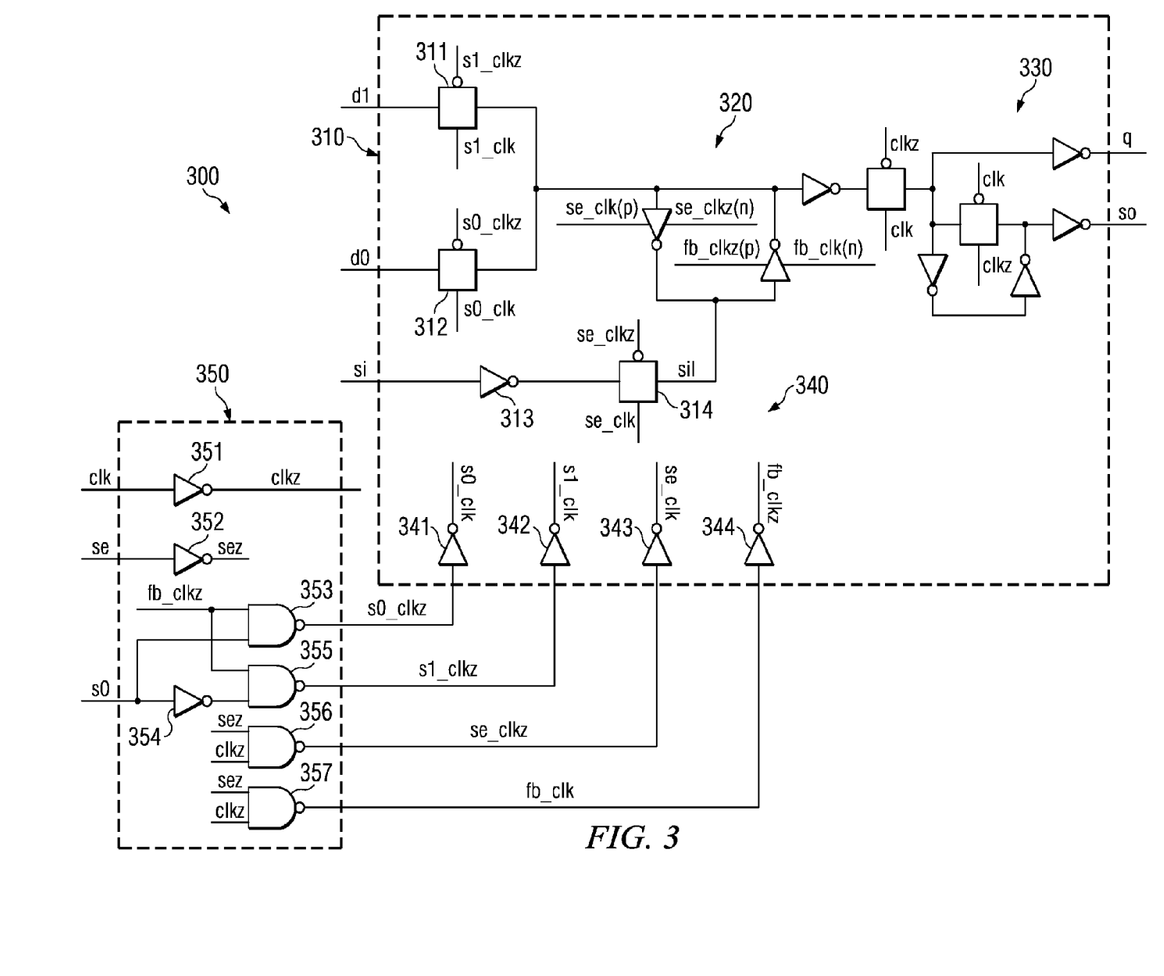
FIG. 3 is a circuit diagram of a two-input multiplexer/flip-flop according to this invention.

FIG. 3 illustrates a two-input multiplexer/flip-flop 300 according to this invention. FIG. 3 generally illustrates a single bit circuit of what is generally a multi-bit circuit. Two-input multiplexer/flip-flop 300 is a substitute for prior art two-input multiplexer/flip-flop 100. Two-input multiplexer/flip-flop 300 includes: input section 310 including pass gates 311, 312 and 314 and inverter 313; master flip-flop section 320 is similar to master flip-flop section 120; slave flip-flop section 330 is similar to slave flip-flop section 130; per bit control section 340 including inverters 341, 342, 343 and 344; and shared control section 350 including inverters 351, 352 and 354 and NAND gates 353, 355, 356 and 357.

Input section 310 receives data inputs d0 and d1 and scan input si. Note that shared control section 350 receives selection input s0. Per bit control section 340 and shared control section 350 cooperate to generate the paired control signals s0_clk/s0_clkz, s1_clk/s1_clkz and se_clk/se_clkz. Paired control signals s0_clk/s0_clkz control pass gate 312. Paired control signals s1_clk/s1_clkz control pass gate 311. Pass gates 311 and 312 are driven by opposite polarities of selection input s0. Depending upon the digital state of selection input s0, one and only one of pass gates 311 and 312 is conducting the other pass gate in non-conducting. If pass gate 311 is conducting and pass gate 312 is non-conducting, then input section 310 selects input d1. If pass gate 312 is conducting and pass gate 311 is non-conducting, then input section 310 selects input d0. The selected input signal supplies the input of master flip-flop section 320. Inverter 313 receives scan input s1 and drives pass gate 314. Pass gate 314 is controlled by the signal pair se_clk/se_clkz. Pass gate 314 when enabled supplies scan input si to master flop-flop section 320.

Master flip-flop section 320 is similar to master flip-flop section 120 and will not be described in detail.

Slave flip-flop section 330 is similar to slave flip-flop section 130 and will not be described in detail.

Per bit control section 340 operates in conjunction with shared control section 350. Shared control section 350 receives input signals clk, se and s0 for a set of similarly controlled bit circuits and generates intermediate control signals s0_clkz, s1_clkz, se_clkz and fb_clk. Per bit control section 340 of each bit circuit receives these intermediate signals and generates control signals s0_clk, s1_clk, se_clk and fb_clkz which control operation of two-input multiplexer/flip-flop 300.

Shared control section 350 includes inverters 351, 352 and 354 and NAND gates 353, 355, 356 and 357. Inverter 351 receives clock signal clk and generates inverse clock signal clkz. Inverter 352 receives enable signal se and generates inverse enable signal sez. NAND gate 353 receives signal fb_clkz and selection signal s0 and generates signal s0_clkz. Inverter 354 receives selection signal s0 and supplies one input to NAND gate 355. Another input of NAND gate 355 receives signal fb_clkz. NAND gate 355 generates signal s1_clkz. NAND gate 356 receives inputs scan enable signal se and inverted clock signal clkz and generates signal se_clks. NAND gate 356 receives inverted scan enable signal sez and the inverted clock signal clkz and generates signal fb_clk.

Per bit control section 340 includes inverters 341, 342, 343 and 344. Inverter 341 receives signal s0_clkz and generates signal s0_clk. Inverter 342 receives signal s1_clkz and generates signal s1_clk. Inverter 343 receives signal se_clkz and generates signal se_clk. Inverter 344 receives signal fb_clk and generates signal fb_clkz.

Two-input multiplexer/flip-flop 300 operates generally as follows. Select signal s0 determines selection of either input d0 or input d1. When enabled by scan enable signal se, the selected signal is passed to master flip-flop section 120 and then to slave flip-flop section 130 where it becomes available at output q. Scan input si supplies master flip-flop section 320 when enabled by scan enable signal se.

Two-input multiplexer/flip-flop 300 of this invention is advantageous over prior art two-input multiplexer/flip-flop 100. The two layer pass gate input of prior art two-input multiplexer/flip-flop 100 is replaced by a single layer pass gate input in two-input multiplexer/flip-flop 300 of this invention. This reduction is pass gate layers is achieved by making input pass gates 311 and 312 of this invention controlled by clocked signal pairs s0_clk/s0_clkz and s1_clk/s1_clkz. This combines the input selection of pass gates 111 and 112 and the clocking of pass gate 114 in a single layer of pass gates. This results in reduced setup time, reduced driver size and reduced power consumption.

Figure 4:
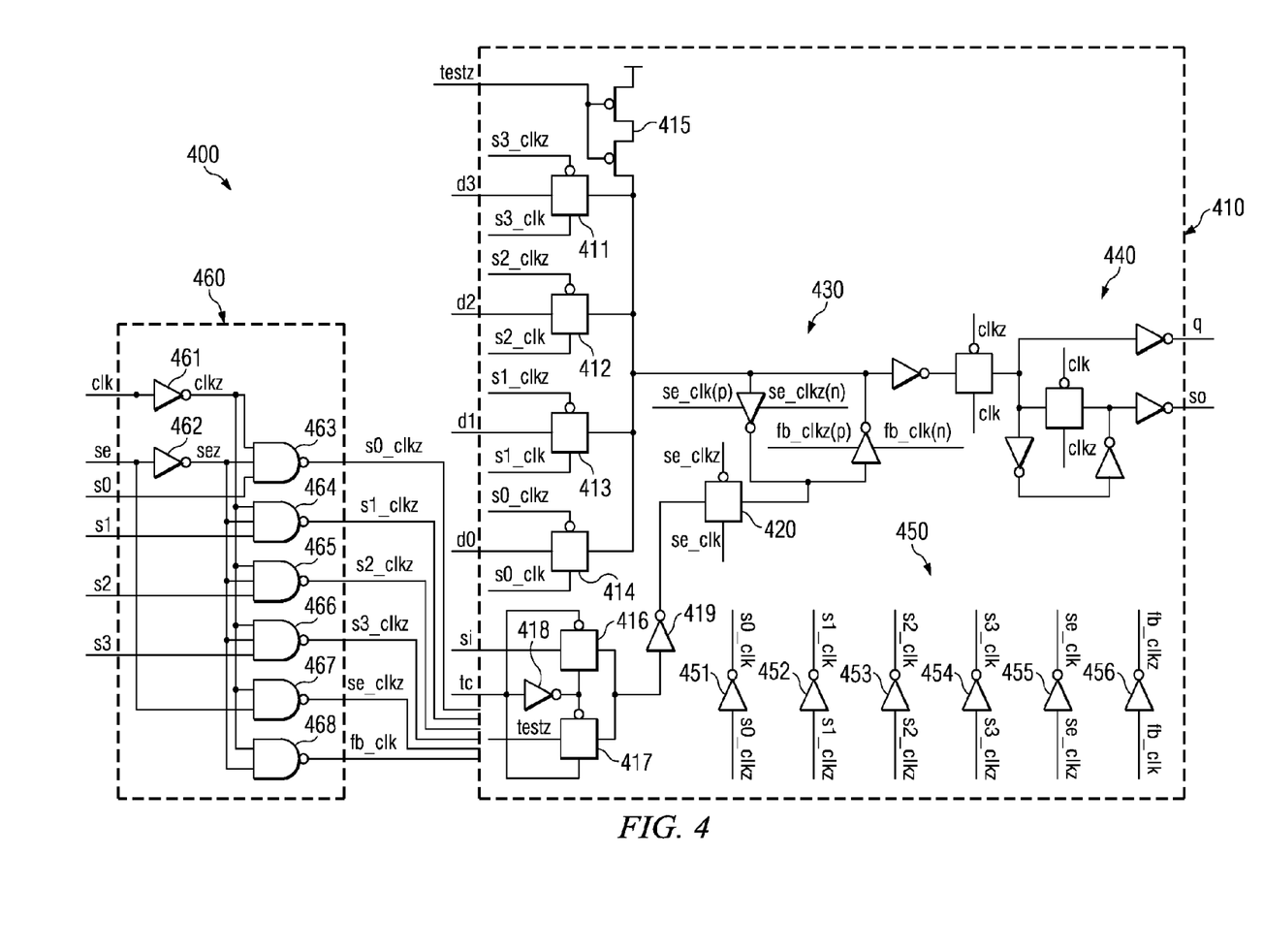
FIG. 4 is a circuit diagram of a four-input multiplexer/flip-flop including a test input according to this invention.

FIG. 4 illustrates a four-input multiplexer/flip-flop 400 of this invention. FIG. 4 illustrates a single bit circuit of what is generally a multi-bit circuit. Four-input multiplexer/flip-flop 400 includes: input section 410 including pass gates 411, 412, 413, 414, 416, 417 and 421, driver 415 and inverter 419; master flip-flop section 430 is similar to master flip-flop section 120; slave flip-flop section 440 is similar to output section 130; per bit control section 450 including inverters 441, 442, 443, 444, 445 and 456 and pass gates 441, 442 and 445; and shared control section 460 including inverters 461 and 462 and NAND gates 463, 464, 465, 466, 467 and 468.

Input section 410 receives data inputs d0, d1, d2 and d3, selection signal pairs s0_clk/s0_clkz, s1_clk/s1_clkz, s2_clk/s2_clkz and s3_clk/s3_clkz. Depending upon the state of the selection signal pairs s0_clk/s0_clkz, s1_clk/s1_clkz, s2_clk/s2_clkz and s3_clk/s3_clkzz one of pass gates 411, 412, 413 and 414 passes the corresponding input signal d3, d2, d1 or d0. The selection signals pairs s0_clk/s0_clkz, s1_clk/s1_clkz, s2_clk/s2_clkz and s3_clk/s3_clkz are controlled to open only one of the pass gates 411, 412, 413 and 414. The selected input signal supplies the input of master flip-flop section 430.

Input section 410 further includes a testz input driving the gates of dual MOS transistor driver 415. A signal upon the testz input forces master flip-flop section 420 into a predetermined state regardless of other inputs. This testz input enables test of multiplexer/flip-flop 400.

Input section 410 further includes pass gate 416 receiving scan input signal si. Pass gate 417 receives test signal testz. Inverter 418 receives test active signal tc and generates its inverse. Pass gates 416 and 417 are driven by opposite polarities of test active signal tc. Depending on the signal level of test active signal tc only one of pass gates 416 or 417 is conducting. The output of pass gates 416 and 417 drive the input to inverter 419. The output of inverter 419 drives the input of pass gate 420. Pass gate 420 is controlled by the signal pair se_clk/se_clkz. Depending on the signal level of test active signal tc, one of initialization signal si or test signal testz is supplied to master flip-flop section 430.

Master flip-flop section 430 is similar to master flip-flop section 120 and will not be described in detail.

Slave flip-flop section 440 is similar to slave flip-flop section 130 and will not be described in detail.

Per bit control section 450 operates in conjunction with shared control section 460. Shared control section 460 receives clock signal clk, scan enable signal se and selection signals s0, s1, s2 and s3 for a set of similarly controlled bit circuits and generates intermediate control signals s0_clkz, s1_clkz, s2_clkz, s3_clkz, se_clkz and fb_clk. Per bit control section 350 of each bit circuit receives these intermediate signals and generates control signals s0_clk, s1_clk, s2_clk, s3_clk, se_clk and fb_clkz which control operation of two-input multiplexer/flip-flop 400.

Shared control section 460 includes inverters 461 and 462 and NAND gates 463, 464, 465, 466, 467 and 468. Inverter 461 receives clock signal clk and generates inverse clock signal clkz. Inverter 462 receives scan enable signal se and generates inverse scan enable signal sez. NAND gate 463 receives inverted clock signal clkz, inverted scan enable signal sez and selection signal s0 and generates signal s0_clkz. NAND gate 464 receives inverted clock signal clkz, inverted scan enable signal sez and selection signal s1 and generates signal s1_clkz. NAND gate 465 receives inverted clock signal clkz, inverted scan enable signal sez and selection signal s0 and generates signal s0_clkz. NAND gate 466 receives inverted clock signal clkz, inverted scan enable signal sez and selection signal s3 and generates signal s3_clkz. NAND gate 467 receives inputs scan enable signal se and inverted clock signal clkz and generates signal se_clks. NAND gate 468 receives inverted scan enable signal sez and the inverted clock signal clkz and generates signal fb_clk.

Per bit control section 450 includes inverters 451, 452, 453, 454, 455 and 456. Inverter 451 receives signal s0_clkz and generates signal s0_clk. Inverter 452 receives signal s1_clkz and generates signal s1_clk. Inverter 453 receives signal s2_clkz and generates signal s2_clk. Inverter 454 receives signal s3_clkz and generates signal s3_clk. Inverter 455 receives signal se_clkz and generates signal se_clk. Inverter 456 receives signal fb_clk and generates signal fb_clkz.

Four-input multiplexer/flip-flop 200 operates generally as follows. Select signals s0, s1, s2 and s3 determine selection of either input d0, d1, d2 or d3. When enabled by scan enable signal se (scan disabled), the selected signal is passed to master flip-flop section 4300 and then to slave flip-flop section 440 where it becomes available at output q. Testz places master flip-flop 430 in a known state. Scan input si when enabled by clks/clksz supplies the input of master flip-flop 430.

Four-input multiplexer/flip-flop 400 has two advantages over prior art four-input multiplexer/flip-flop 200. The first advantage is a reduction in the number of pass gate layers in input section 410. Control of pass gates 411, 412, 413 and 414 by clocked versions of the enable signals enables use of a single pass gate level (pass gates 411, 412, 413 and 414) rather than the two pass gate levels (first 211, 212, 213 and 214 and second pass gate 216) of prior art four-input multiplexer/flip-flop 200. This advantage is described above in conjunction with two-input multiplexer/flip-flop 300. Four-input multiplexer/flip-flop 400 includes another advantage in the second testz input. Four-input multiplexer/flip-flop 400 provides a second input for the testz signal by muliplexing with scan input signal si. This second input enables testing the original test input.

Figure 5A:
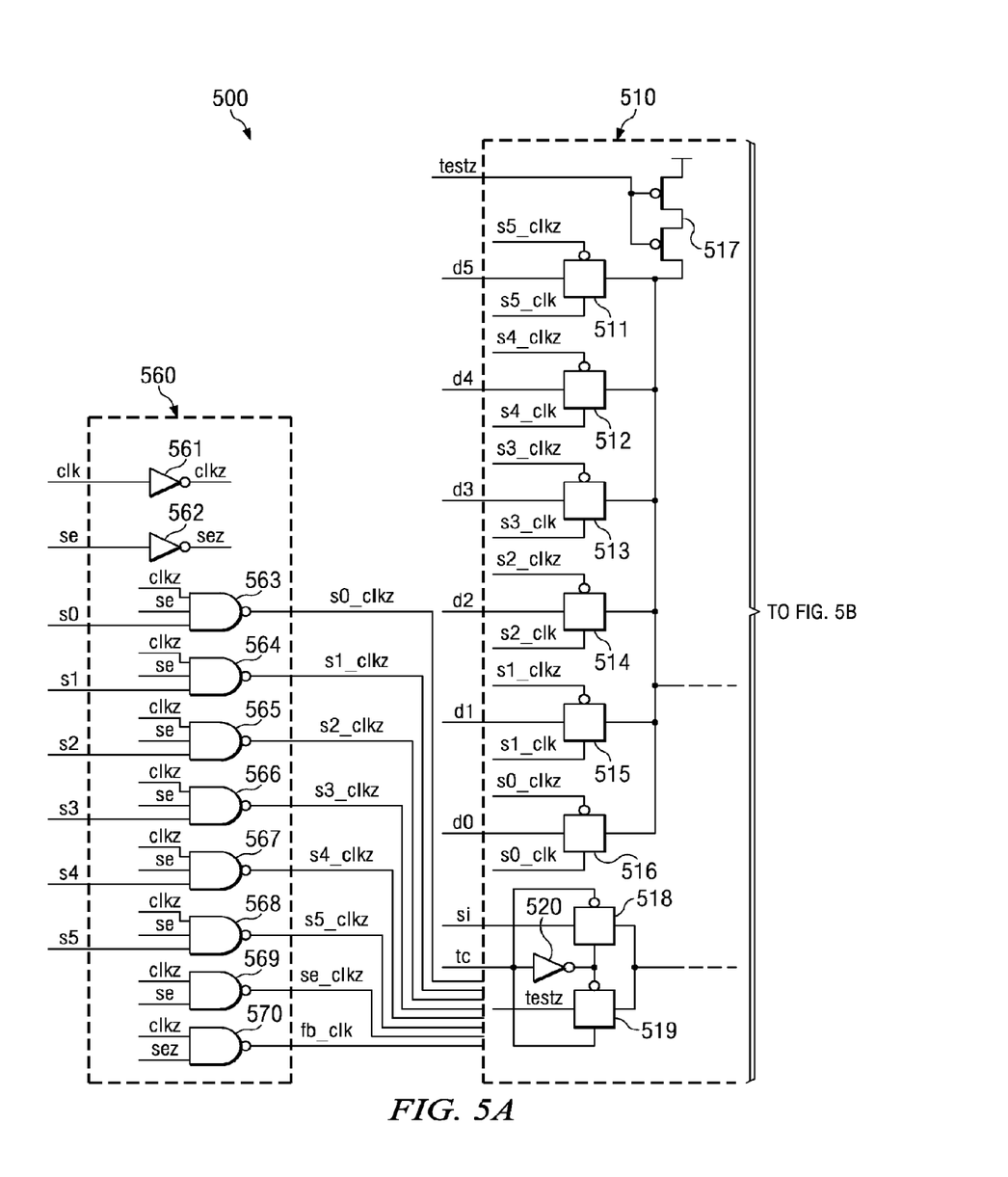
FIG. 5 is a circuit diagram of a six-input multiplexer/flip-flop including a test input according to this invention.
Figure 5B:
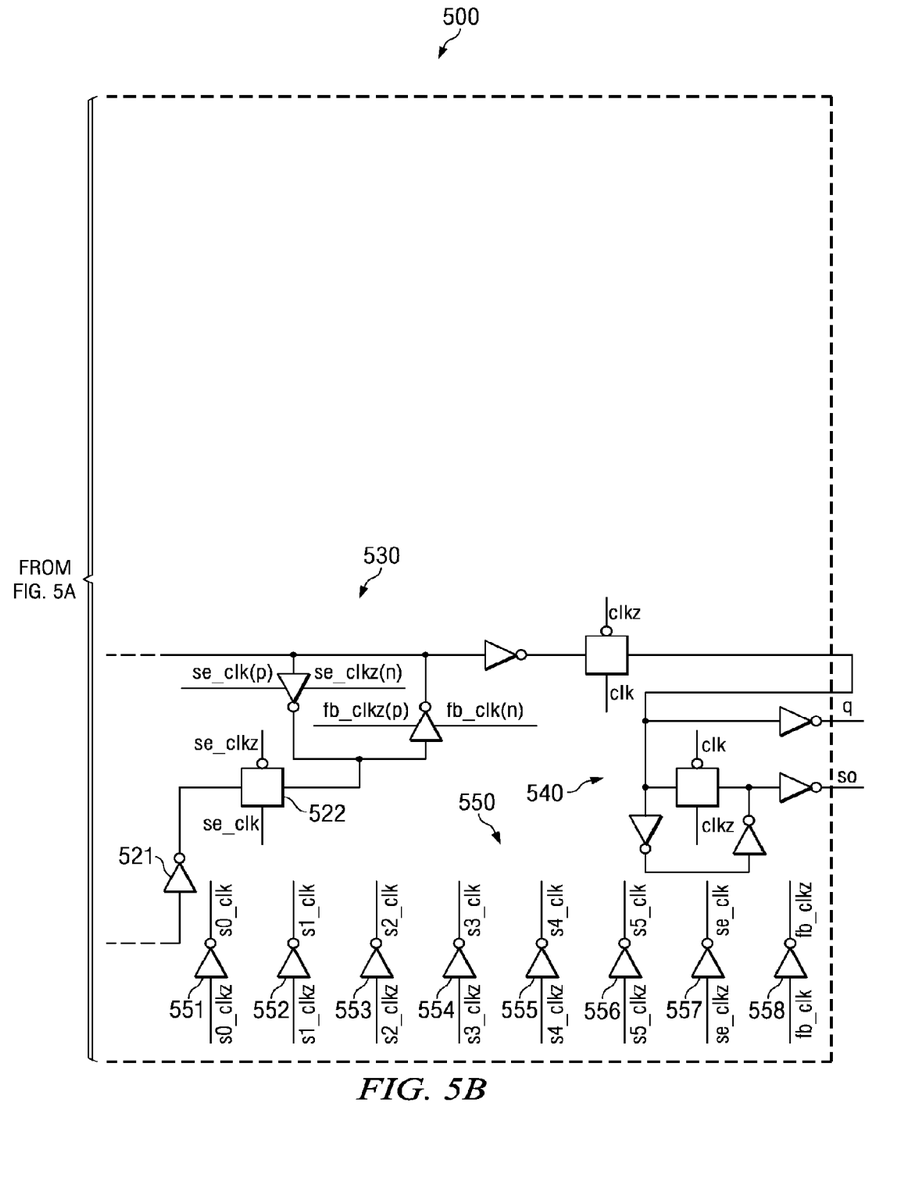

FIG. 5 illustrates a six-input multiplexer/flip-flop 500 of this invention. FIG. 5 illustrates a single bit circuit of what is generally a multi-bit circuit. Six-input multiplexer/flip-flop 500 includes: input section 510 including pass gates 511, 512, 513, 514, 515, 516, 517, 518 and 522, driver 517 and inverters 520 and 521; master flip-flop section 530 is similar to master flip-flop section 120; slave flip-flop section 540 is similar to output section 130; per bit control section 550 including inverters 551, 552, 553, 554, 555, 556, 557 and 558; and shared control section 460 including inverters 561 and 562 and NAND gates 563, 564, 565, 566, 567, 568, 560 and 570. Six-input multiplexer/flip-flop 500 is very similar to four-input multiplexer/flip-flop 400 with the addition of two pass gates in input section 510, two inverters in per bit control section 550 and two NAND gates in shared control section 560 to accommodate two additional inputs. Six-input multiplexer/flip-flop 500 includes the same advantages over the prior art as previously noted above in conjunction with four-input multiplexer/flip-flop 400.

Figure 6:
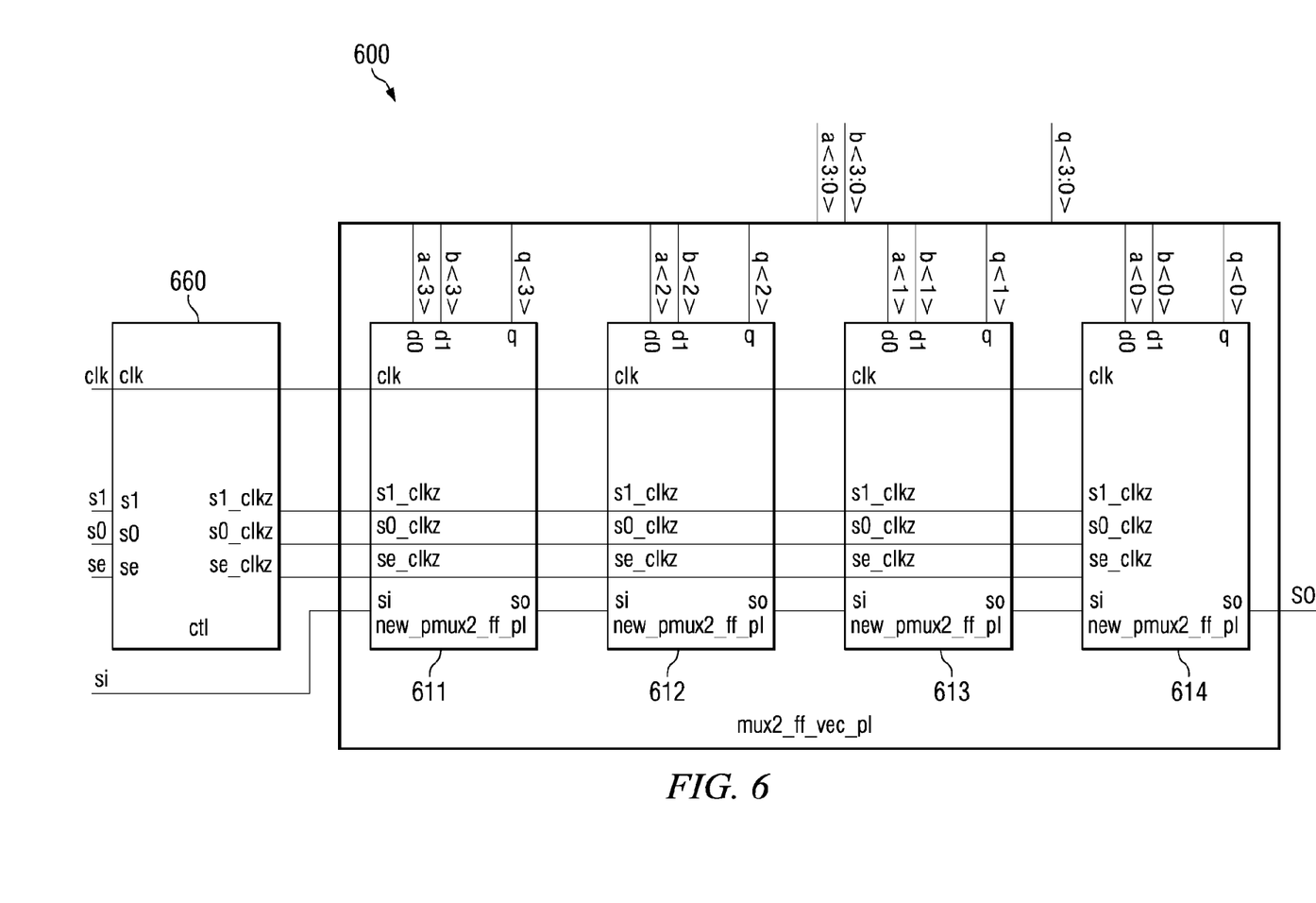
FIG. 6 is a block diagram illustrating the manner of sharing decode logic among four two-input multiplexers according to this invention.

FIG. 6 illustrates circuit 600 connecting plural two-input multiplexer/flip-flop sections 611, 612, 613 and 614 with shared control section 660. Each of two-input multiplexer/flip-flop sections 611, 612, 613 and 614 receives a corresponding bit of two multibit signals a<3:0> and b<3:0> and generates a corresponding bit output q<3:0>. Each of two-input multiplexer/flip-flop circuits 611, 612, 613 and 614 and shared control section 660 receive the clock signal clk. Shared control section 660 also receives control signals s0 and s1 and scan enable signal se. Shared control section 660 generates intermediate signals s0_clkz, s1_clkz and se_clkx which are transmitted to each of the two-input multiplexer/flip-flop sections 611, 612, 613, 614, 615 and 616. Two-input multiplexer/flip-flop section 611 receives scan input signal si. Each two-input multiplexer/flip-flop section 611, 612 and 613 passes a scan output so to the scan input si of a next two-input multiplexer/flip-flop section 612, 613 and 614.

Figure 7:
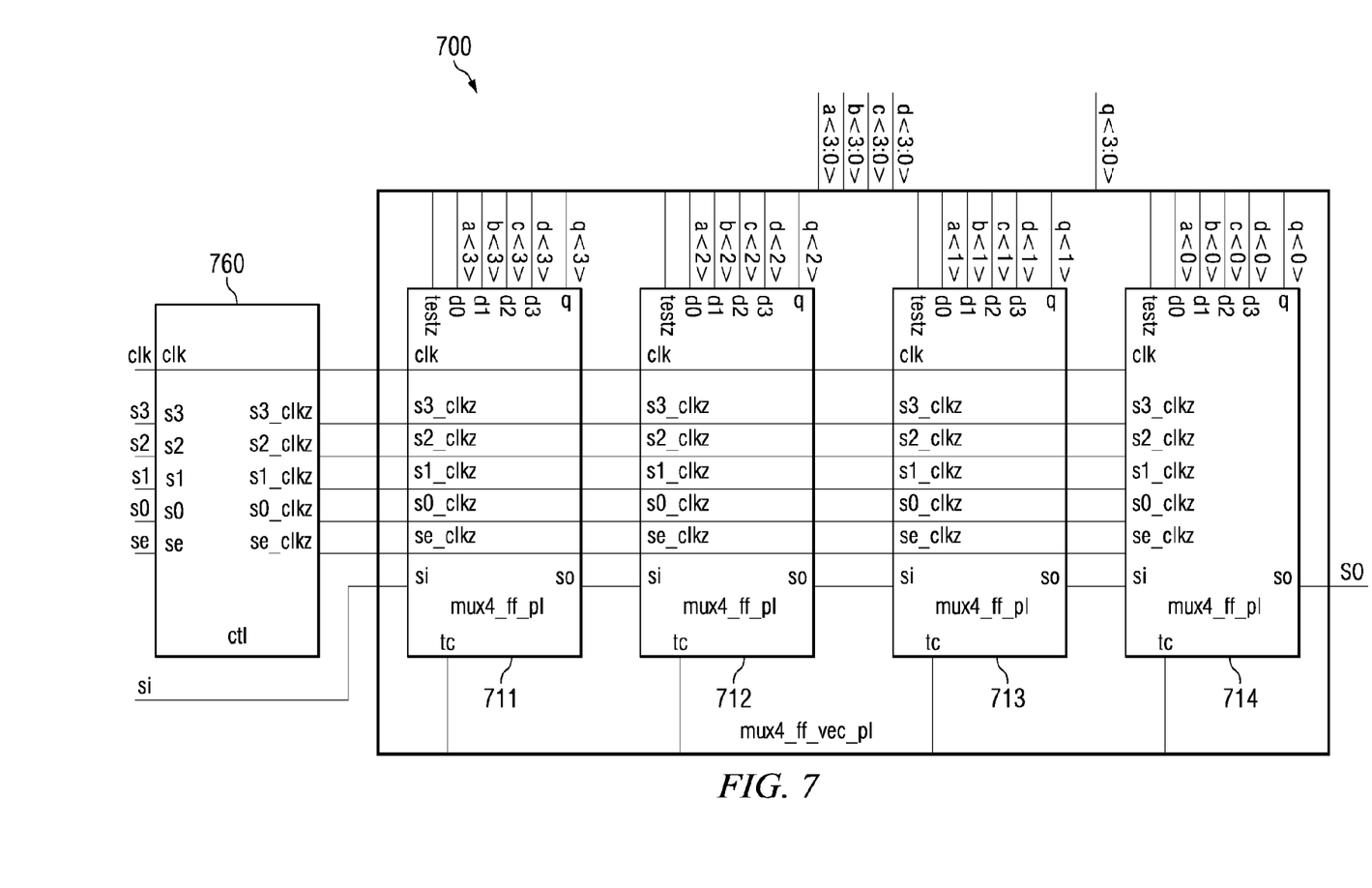
FIG. 7 is a block diagram illustrating the manner of sharing decode logic among four four-input multiplexers according to this invention.

FIG. 7 illustrates circuit 700 connecting plural four-input multiplexer/flip-flop sections 711, 712, 713 and 714 with shared control section 760. Each of four-input multiplexer/flip-flop sections 711, 712, 713 and 714 receives a corresponding bit of four multibit signals a<3:0>, b<3:0>. c<3:0> and d<3:0> and generates a corresponding bit output q<3:0>. Each of four-input multiplexer/flip-flop circuits 711, 712, 713 and 714 and shared control section 760 receive the clock signal clk. Shared control section 760 also receives control signals s0, s1, s2 and s3 and an enable signal se. Shared control section 760 generates intermediate signals s0_clkz, s1_clkz, s2_clkz, s3_clkz and se_clkz which are transmitted to each of the four-input multiplexer/flip-flop sections 711, 712, 713 and 714. Four-input multiplexer/flip-flop section 711 receives the scan input signal si. Each four-input multiplexer/flip-flop section 711, 712 and 713 passes a scan output so to the scan input si of a next two-input multiplexer/flip-flop section 712, 713 and 714. Each of the four-input multiplexer/flip-flop sections 711, 712, 713 and 714 receives a test input testz and a test active signal tc.

Table 2 lists a comparison of propertied of the prior art four-input multiplexer/flip-flop 200 illustrated in FIG. 2 with those of four-input multiplexer/flip-flop 400 illustrated in FIG. 4.

TABLE 2

|  | Prior Art 200 | Invention 400 |
| --- | --- | --- |
| clk2q1 | 29.86 | 29.85 |
| clk2q0 | 27.35 | 27.90 |
| setup1 | 87.82 | 54.71 |
| setup0 | 109.20 | 65.59 |
| hold0 | 30.73 | 24.04 |
| hold1 | 31.65 | 31.84 |
| BHT | 136.06 | 95.44 |
| Vx/V1 | 100% | 69% |
| Fscaling | 100% | 143% |
| Average Leakage | −9.20E−06 | −1.35E−05 |
| Vx/V1 | 100% | 147% |
| Average clock non-toggling power | −1.28E−14 | −1.40E 14 |
| Vx/V1 | 100% | 109% |

In Table 2: clk2q1 and clk2q0 are the times from the rising edge of the clock signal clk until corresponding data d1 or d0 arrives on the q output of the circuit; setup0 and setup1 are the length of the interval before the rising clock edge of the clk signal the respective data inputs d0 and d1 must be present to be sensed; hold0 and hold1 are the respective hold times for inputs d0 and d1; BHT is the so-called black hole time which it the sum of the setup time and the clock to q time. The Vx/V1 rows are percentage comparisons with the prior art set to 100%. The Fscaling row shows the percentage improvement in BHT of this invention.

What is claimed is:

1. A combined multiplexer and flip-flop circuit comprising:
   a input section having
      an input terminal for each of a plurality of input signals,
      a plurality of input pass gates equal in number to the number of input terminals, each input pass gate having an input connected to a corresponding input terminal, an output and corresponding control terminals;
   a flip-flop section having an input connected to said output of each pass gate and an output; and
   a control section receiving a clock signal and at least one control signal indicating selection of only one of said input signals, said control section including
      a logical NAND for each input signal, said logical NAND having a first input receiving said clock signal and a second input receiving a corresponding input selection signal for a corresponding input signal,
      an inverter having an input connected to a corresponding logical NAND and an output;

wherein each input pass gate receives signals at said control terminals from a corresponding logical NAND and said corresponding inverter.

2. The combined multiplexer and flip-flop circuit of claim 1, wherein:
said input section has two input terminals for two input signals;
said at least one control signal includes one control signal having a first state indicating selection of a first of said two input signals and a second state indicating selection of a second of said two input signals; and
said control section includes an inverter having an input receiving said one control signal, wherein said one control signal comprises said input selection signal for said first of said two input signals and said output of said inverter comprises said input selection signal for said second of said two input signals.

3. The combined multiplexer and flip-flop circuit of claim 1, wherein:
said input section has more than two input terminals for more than two input signals;
said at least one control signal includes one control signal corresponding to each input signal, each control signal having a first state indicating selection of said corresponding input signal and a second state indicating not selection of said corresponding input signal, wherein only one control signal at a time has said first state.

4. The combined multiplexer and flip-flop circuit of claim 1, wherein:
said input section further includes
a scan input receiving a scan input signal,
a scan input pass gate having an input connected to said scan input, an output connected to said flip-flop section and corresponding control terminals; and
said control section further includes
a scan enable input terminal receiving a scan enable input signal having a first state indicating normal operation and a second state indicating scan chain operation,
a scan enable logical NAND having a first input receiving said clock signal and a second input receiving said scan enable signal,
a scan enable inverter having an input connected to said scan enable logical NAND and an output; and
wherein said logical NAND for each input signal further forms a logical NAND with said scan enable signal wherein all said input pass gates are non-conducting when scan enable signal is in said second state; and
wherein said scan input pass gate receives signals at said control terminals from said scan enable logical NAND and said scan enable inverter.

5. The combined multiplexer and flip-flop circuit of claim 4, wherein:
said input section further includes
a test input terminal for receiving a test input signal,
a test select input terminal for receiving a test select signal having a first state selecting normal operation and a second state selecting a test input,
a driver circuit including at least one MOS transistor having a source connected to a voltage source, a drain connected to said input of said flip-flop section; and
wherein said scan input pass gate includes
a first scan input pass gate having an input connected to said scan input, an output connected to said flip-flop section and corresponding control terminals,
a second scan input pass gate having an input connected to said test input terminal, an output connected to said flip-flop section and corresponding control terminals, and
a test select inverter having an input connected to said test select input terminal and an output terminal,
wherein said control terminals of said first scan input pass gate and said second input pass gate are connected to said test select input terminal and said output of said test select inverter in opposite polarities whereby said first scan input pass gate conducts said scan input signal to said input of said flip-flop section when said test select input is in said first state and said second scan input pass gate conducts said test input signal to said input of said flip-flop section when said test select input is in said second state.

6. A multibit combined multiplexer and flip-flop circuit comprising:
a plurality of bit circuits equal in number to a number of bits to the multibit combined multiplexer and flip-flop circuit, each bit circuit including
a input section having
an input terminal for each of a plurality of input signals,
a plurality of input pass gates equal in number to the number of input terminals, each input pass gate having an input connected to a corresponding input terminal, an output and corresponding control terminals;
a flip-flop section having an input connected to said output of each pass gate and an output; and
a per bit control section having an inverter corresponding to each input terminal having an input and an output;
a combined control section receiving a clock signal and at least one control signal indicating selection of only one of said input signals, said control section including a logical NAND for each input signal, said logical NAND having a first input receiving said clock signal and a second input receiving a corresponding input selection signal for a corresponding input signal and an output connected to a corresponding input of said inverters of said per bit control section; and
wherein each input pass gate receives signals at said control terminals from a corresponding logical NAND and said corresponding inverter.

7. The multibit combined multiplexer and flip-flop circuit of claim 6, wherein:
said input section of each bit circuit has two input terminals for two input signals;
said at least one control signal includes one control signal having a first state indicating selection of a first of said two input signals and a second state indicating selection of a second of said two input signals; and
said combined control section includes an inverter having an input receiving said one control signal, wherein said one control signal comprises said input selection signal for said first of said two input signals and said output of said inverter comprises said input selection signal for said second of said two input signals.

8. The multibit combined multiplexer and flip-flop circuit of claim 6, wherein:
said input section of each bit circuit has more than two input terminals for more than two input signals;
said at least one control signal includes one control signal corresponding to each input signal, each control signal having a first state indicating selection of said corresponding input signal and a second state indicating not selection of said corresponding input signal, wherein only one control signal at a time has said first state.

9. The multibit combined multiplexer and flip-flop circuit of claim 6, wherein:
said input section of each bit circuit further includes
a scan input receiving a scan input signal,
a scan input pass gate having an input connected to said scan input, an output connected to said flip-flop section and corresponding control terminals; and
said flip-flop section of each bit circuit further includes a scan output;
said combined control section further includes
a scan enable input terminal receiving a scan enable input signal having a first state indicating normal operation and a second state indicating scan chain operation,
a scan enable logical NAND having a first input receiving said clock signal and a second input receiving said scan enable signal,
a scan enable inverter having an input connected to said scan enable logical NAND and an output; and
wherein said logical NAND for each input signal of said combined control section further forms a logical NAND with said scan enable signal wherein all said input pass gates are non-conducting when scan enable signal is in said second state;
wherein said scan input pass gate receives signals at said control terminals from said scan enable logical NAND and said scan enable inverter; and
said scan output of each bit circuit is connected to said scan input of a immediately succeeding bit circuit.

10. The multibit combined multiplexer and flip-flop circuit of claim 9, wherein:
said input section of each bit circuit further includes
a test input terminal for receiving a test input signal,
a test select input terminal for receiving a test select signal having a first state selecting normal operation and a second state selecting a test input,
a driver circuit including at least one MOS transistor having a source connected to a voltage source, a drain connected to said input of said flip-flop section; and
wherein said scan input pass gate includes
a first scan input pass gate having an input connected to said scan input, an output connected to said flip-flop section and corresponding control terminals,
a second scan input pass gate having an input connected to said test input terminal, an output connected to said flip-flop section and corresponding control terminals, and
a test select inverter having an input connected to said test select input terminal and an output terminal,
wherein said control terminals of said first scan input pass gate and said second input pass gate are connected to said test select input terminal and said output of said test select inverter in opposite polarities whereby said first scan input pass gate conducts said scan input signal to said input of said flip-flop section when said test select input is in said first state and said second scan input pass gate conducts said test input signal to said input of said flip-flop section when said test select input is in said second state.

* * * * *